United States Patent
Palanisamy et al.

[11] Patent Number: 5,926,008
[45] Date of Patent: Jul. 20, 1999

[54] APPARATUS AND METHOD FOR DETERMINING THE CAPACITY OF A NICKEL-CADMIUM BATTERY

[75] Inventors: Thirumalai G. Palanisamy, Morris Township, County of Morris; Harmohan Singh, Rockaway; Alpesh Patel, Parsippany; Patrick M. Rudai, Clifton, all of N.J.

[73] Assignee: AlliedSignal Inc., Morristown, N.J.

[21] Appl. No.: 09/153,606

[22] Filed: Sep. 15, 1998

[51] Int. Cl.⁶ .................................................. H02J 7/00
[52] U.S. Cl. ........................................... 320/132; 320/149
[58] Field of Search .................................. 320/132, 156, 320/161, 155

[56] References Cited

U.S. PATENT DOCUMENTS 4,392,101  7/1983  Saar et al. ................................. 320/156

*Primary Examiner*—Peter S. Wong
*Assistant Examiner*—Lawrence Luk
*Attorney, Agent, or Firm*—Loria B. Yeadon

[57] ABSTRACT

The invention provides for a timesaving method of determining the capacity of a nickel cadmium (NiCd). A fully charged NiCd battery under is subjected to a positive sloped current charge ramp and then a negative sloped current charge ramp while continuously monitoring the battery terminal voltage. The voltage is plotted and the maximum slope of the measured terminal voltage determines $I_{gas}$. The value of $I_{gas}$ is compared to a temperature calibration curve to determine the capacity of the battery under test.

7 Claims, 7 Drawing Sheets

APPARATUS AND METHOD FOR DETERMINING THE CAPACITY OF A NICKEL-CADMIUM BATTERY

GOVERNMENT STATEMENT

All or part of this invention was developed with Government support for the United States Navy under Government Contract No. N00164-96-C-0045. The Government has certain rights to this invention under the terms of the contract.

RELATED APPLICATION DATA

This application is related to commonly assigned Palanisamy et al application entitled APPARATUS AND METHOD FOR DETECTING MEMORY EFFECT IN NICKEL-CADMIUM BATTERIES, and incorporated by reference herein.

BACKGROUND OF THE INVENTION

This invention relates to rechargeable batteries, and more particularly to determining the capacity of a nickel cadmium (NiCd) battery. The battery capacity of NiCd batteries are determined by charging the battery to 100% state of charge and then discharging the battery at a constant current. The time required for the battery to discharge to a specified voltage is measured. The battery capacity in ampere-hour (A-hr.) is then calculated by multiplying the time in hours to discharge the battery by the constant discharge current. This method takes several hours of charging and discharging.

At the present time, there is no method for determining the capacity of a NiCd battery without discharging the battery.

There is, therefore, a need for a method to determine the capacity of a NiCd battery without discharging the battery.

DESCRIPTION OF THE INVENTION

This invention provides for a time-saving method for determining the capacity of a nickel cadmium battery, without discharging the battery.

Figure 1:
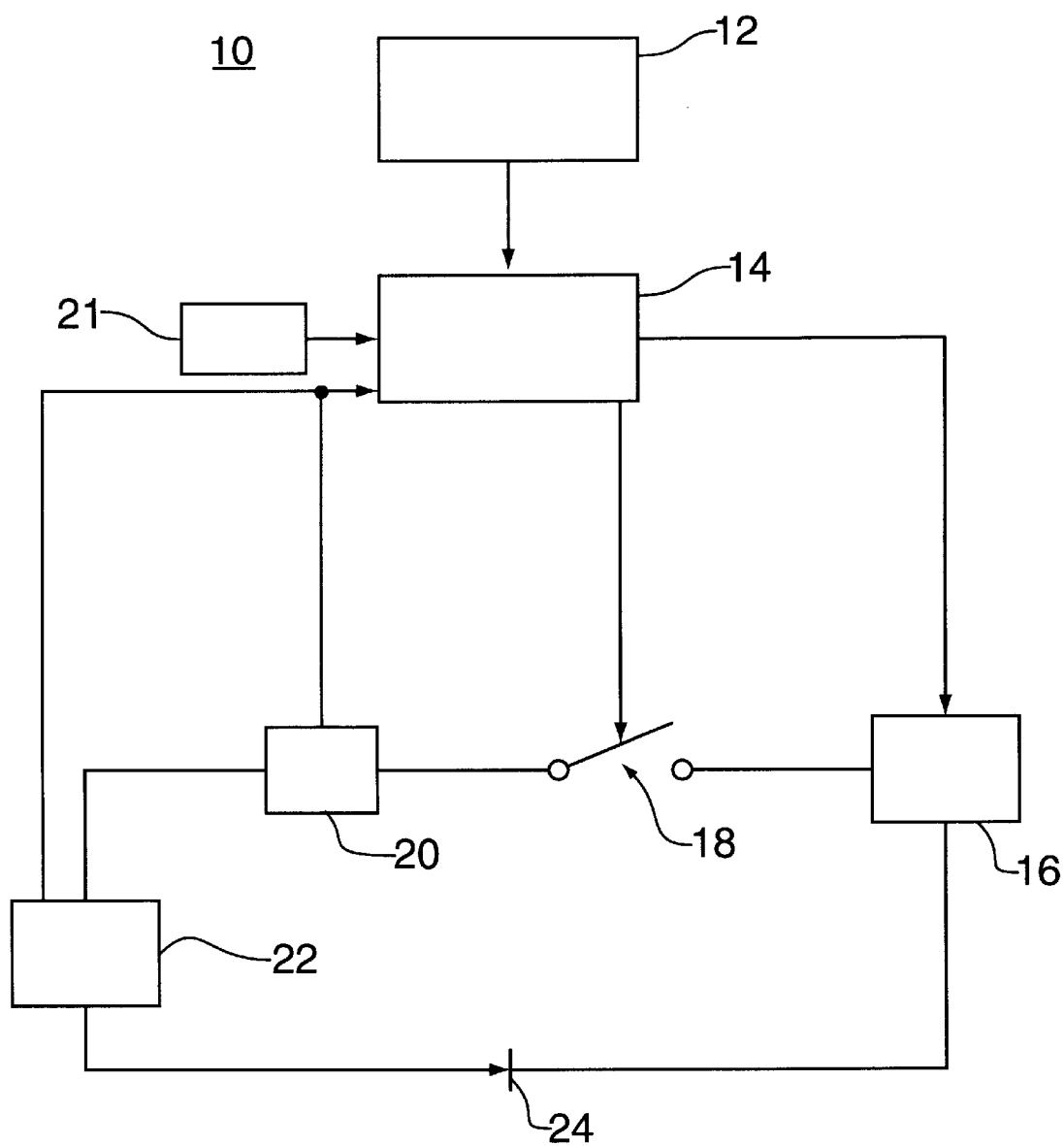
FIG. 1 is a schematic of a battery charging and analyzing circuit.

An exemplary charging system is shown in FIG. 1. A NiCd battery charging system 10 comprises a microprocessor 12 in combination with a data acquisition system 14, such as a National Instruments SCXI data acquisition system. The components of the data acquisition system 14 are Labview 4.0 software, a signal conditioning unit, such as a National Instruments signal conditioning system with digital to analog converters and analog to digital converters and thermocouple modules. System 10 further comprises a programmable power supply 16, a relay 18, a 50A, 50 mV shunt 20 to measure current, a thermocouple 21 to measure temperature, a unit under test 22, in this case, a 24 V NiCd battery, and a diode 24 to protect the power supply. In operation, the microprocessor is programmed using Labview 4.0 to control the current output of the power supply 16 and to close/open the relay 18 to electrically connect/disconnect the battery 22. The microprocessor 12 stores the voltage, current and temperature data acquired by the data acquisition hardware.

Figure 2:
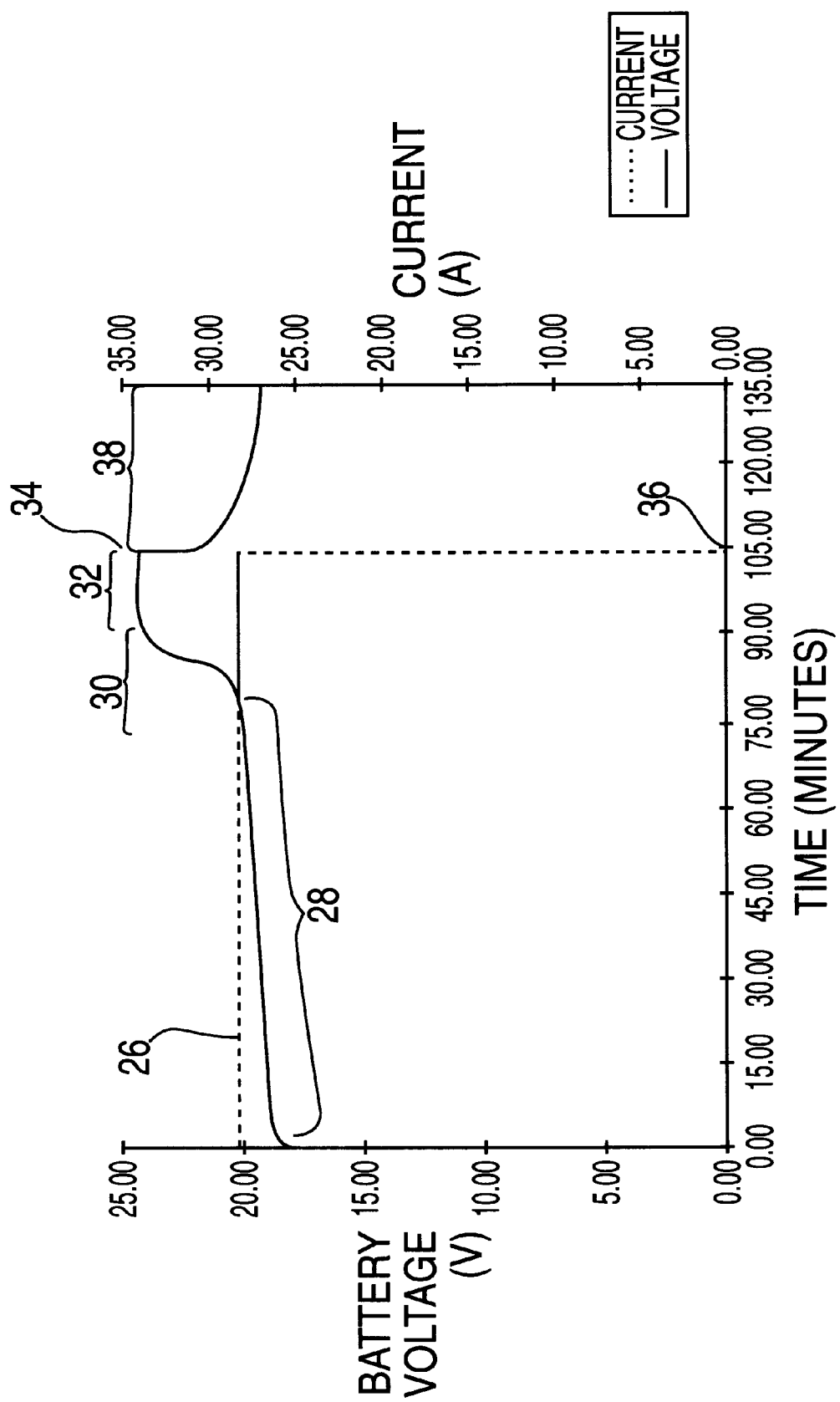
FIG. 2 is a graphical representation of the voltage and current curves during battery charging at room temperature.

Once attached to the charging system 10, the battery 22 is charged to full capacity, i.e. 100% state of charge, as graphically shown in FIG. 2. This is achieved by applying a constant current 26 to the battery. As the battery is subjected to this constant current charge, the voltage goes through three phases: gradual voltage rise indicating charge reaction, as indicated by time period 28; a sharp voltage rise indicating initiation of gas reaction, as indicated by time period 30; and a plateau region showing simultaneous gas reaction and charge reaction, as indicated by time period 32. During time period 28, the battery voltage gradually rises until the cumulative charge delivered to the battery is about 80 to 90% of the battery's charge capacity. At this point, 75% of the battery's capacity is normally available upon discharge. On further charging during time period 30, the battery voltage quickly increases as the battery starts evolving gas towards the end of the charge process. The battery voltage tends to stabilize until the battery is fully charged at the end of time period 32. At time period 34, the battery voltage gradually decreases in the overcharge portion of the charge. After a decrease of 15 mV has been detected in the overcharge, the current charge is terminated at point 36 and the battery is left in open circuit, time period 38 and is fully charged.

Figure 3A:
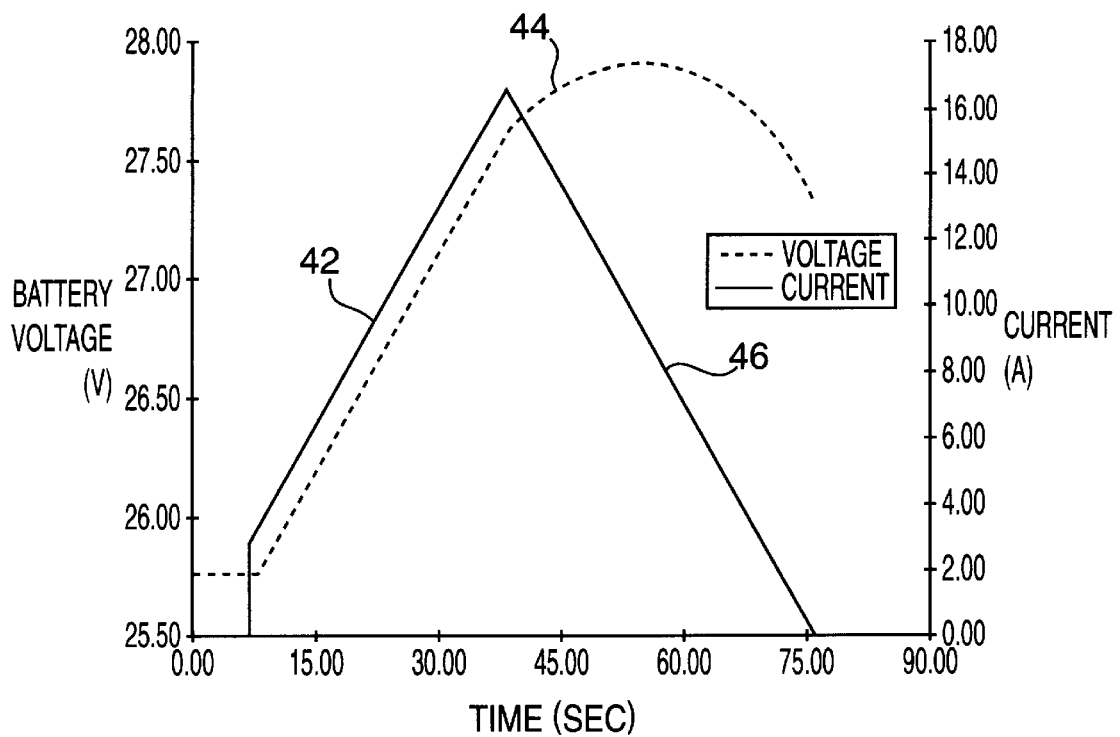
FIG. 3a is a graphical representation of the voltage and current curves in the evaluation cycle of the invention.
Figure 3B:
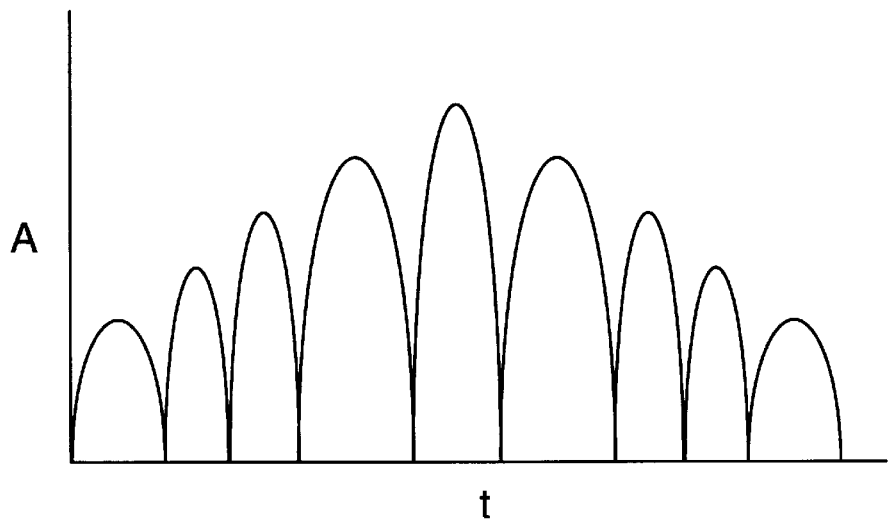
FIG. 3b is an alternate current charging curve.

After the battery 22 comes to a stabilized status in terms of temperature and open circuit voltage, it is subjected to a test cycle. Before starting the test cycle, safe voltage and current limits are established from the known characteristics of the battery as would be published by the battery manufacturer. During the test cycle, an increasing charge current 42 is applied to the battery. Preferably, the charge current is started from zero and increases linearly up to the maximum current the charging system can output or to the identified safe battery voltage and current limits, whichever is lower. In actual practice, the charge current will be as shown in FIG. 3a due to the output lag time of the power supply compared with the programmed value. The increasing current charge does not have to be linear, as long as it increases as a known function of time. Alternatively, consecutive pulses with an increasing current amplitude can also be used during the ramp test as shown in FIG. 3b.

Figure 4:
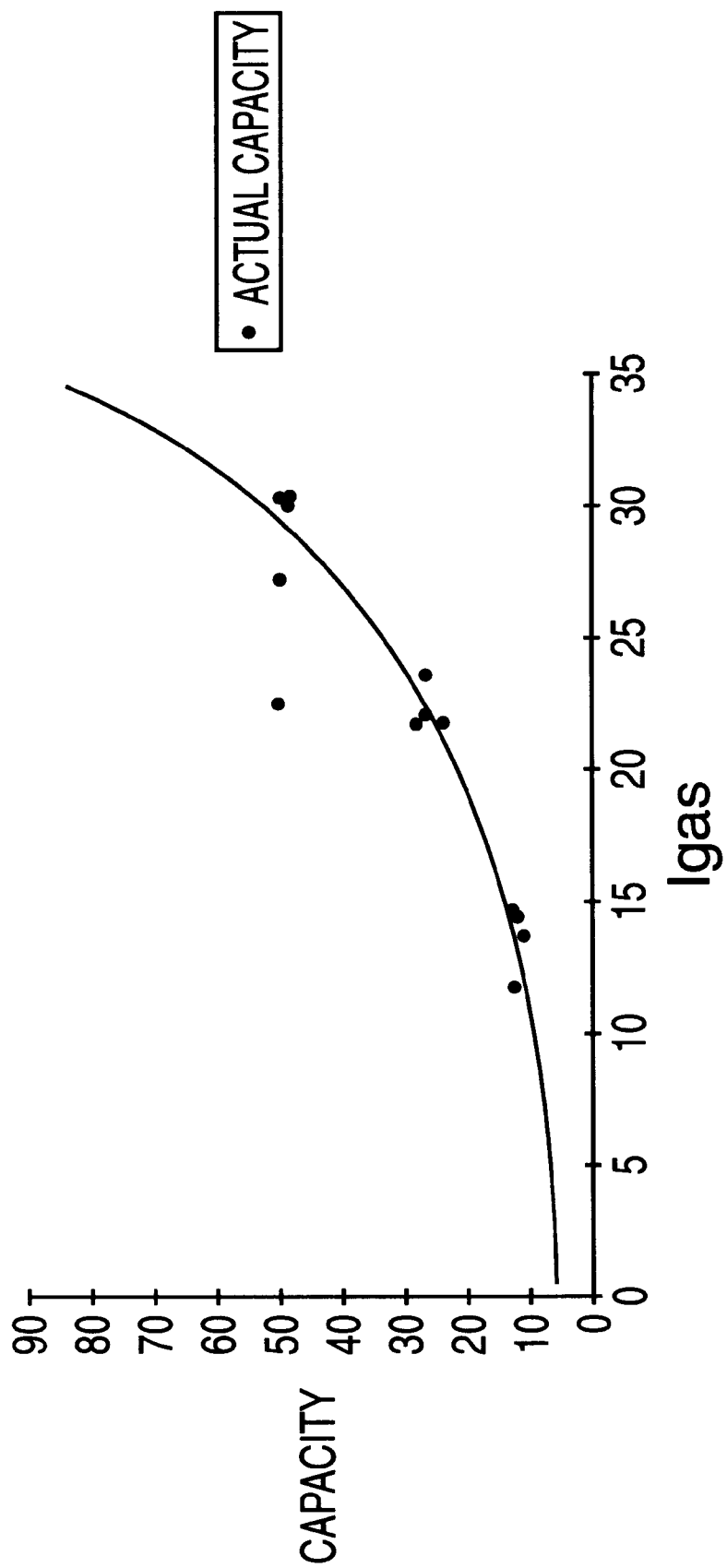
FIG. 4 is a graphical representation of the capacity-temperature calibration curve at room temperature.
Figure 5:
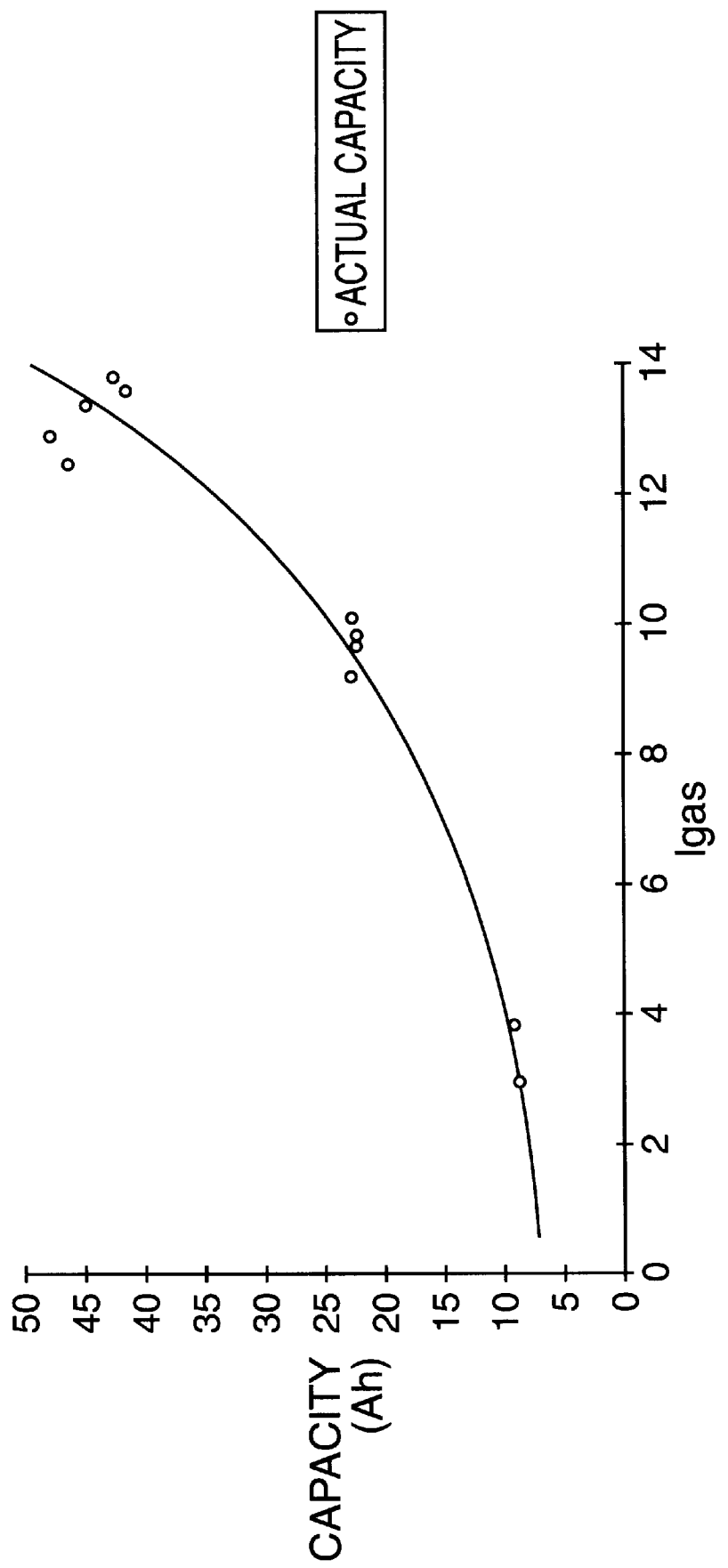
FIG. 5; is a graphical representation of the capacity-temperature calibration curve at −30° C.

The current charge ramp is then decreased at any negative slope 46 until the current reaches zero. Preferably, the slope of the decreasing current charge is the same slope as the current charge 42. During the current charge phases 42 and 46, the battery terminal voltage 44 is continuously measured and recorded. The slope of the voltage curve is also calculated. When the slope goes through a maximum it indicates the transition from charge reaction to gas reaction. The current at this transition point is referred to as the gas current ($I_{gas}$). We have demonstrated that $I_{gas}$ correlates with the battery capacity. Further, $I_{gas}$ is a function of ambient battery temperature and accordingly, the correlation between $I_{gas}$ and battery capacity must be performed at a given temperature for fully charged nickel-cadmium batteries. Calibrations for nickel cadmium batteries at 21° C. and −30° Celcius are shown in FIGS. 4 and 5.

Determination of the slope of the voltage curve is accomplished by calculating the difference in successive voltage values over a small interval. This data is then subjected to a five point moving averaging technique that was found to provide a reliable method to suppress noise caused by the electronics circuitry. As is known to those skilled in the art, any digital filtering technique to suppress noise may be used. Averaging methods using less than 5 data points did not suppress the noise adequately; hence did not provide satisfactory results. Using more than 5 points in the average reduces the peak intensity severely. Peak detection was accomplished by comparing each voltage difference point with an average of two voltage difference points before and after the point. The point should be greater than both the averages by a predetermined margin in order to indicate a maximum in slope. The current at this point is determined to be the $I_{gas}$ for the battery. The battery's capacity is calculated using this $I_{gas}$ and a temperature calibrated curve.

A temperature-calibrated curve is determined as follows. Nickel cadmium batteries of various capacities were subjected to the charge regime as described above. Once the battery was completely charged, it was left in open circuit until the temperature and voltage stabilized. Once the battery was in an equilibrium state, it was subjected to test cycle outlined above and the $I_{gas}$ value was noted. Next, the battery was completely discharged. This was accomplished by drawing a constant current from the battery. The discharge was terminated when the battery voltage dropped to 0.95 volts per cell. The capacity value was calculated by multiplying the discharge current by the amount of time required to reach 0.95 volts per cell. The calibration curve was generated using the capacity and $I_{gas}$ values from numerous iterations to the above procedure with different nickel cadmium batteries.

The safe voltage and current limits imposed on the system during the ramp test cycle significantly affect the gas current, $I_{gas}$. Therefore it is important to remember that one can set these limits at different values within a range for nickel cadmium batteries and generate different calibration curves. As long as the battery whose capacity has to be determined is subjected to the same conditions as the calibration curve batteries, the results should be satisfactory. For example the safe voltage limit for nickel-cadmium batteries can be set at in the range 1.3 to 1.65 volts per cell.

EXAMPLE 1

Figure 6:
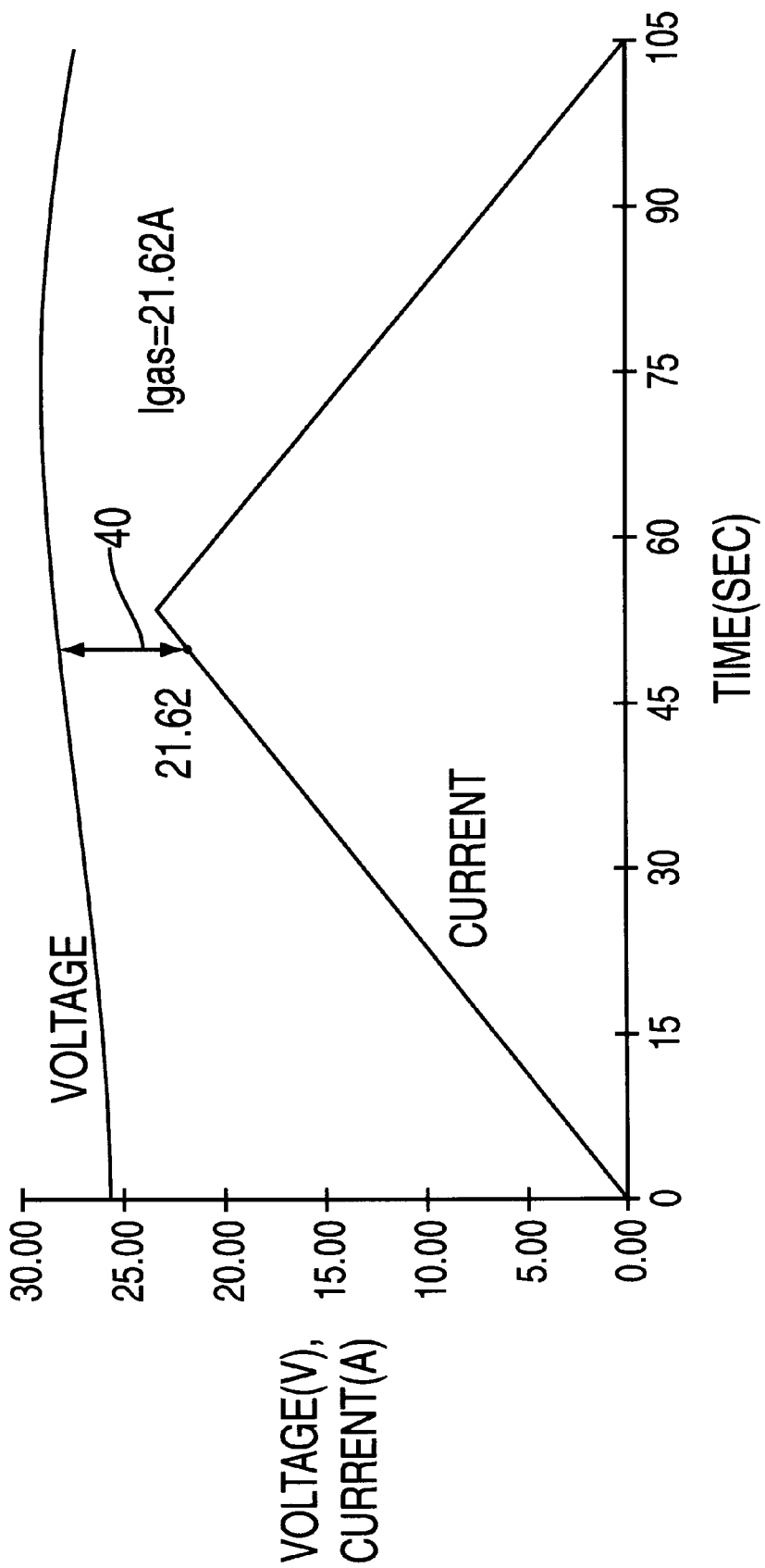
FIG. 6; is a graphical representation of the voltage and current curves of a 20 Ah, 24 V NiCd battery under test in accordance with the invention.

Referring to FIG. 6, a 20 Ah, 24 V NiCd battery was completely charged, following the charge regime described above. Once at an equilibrium state, the battery was subjected to a test cycle. Voltage and current data from the test cycle are shown in FIG. 6. In the figure, the maximum slope and the corresponding current are indicated by the arrows. It was determined, via the methods described above, that the battery had 28.1 Ah available capacity. Upon a complete discharge, the battery was found to provide 27.8 Ah.

EXAMPLE 2

Figure 7:
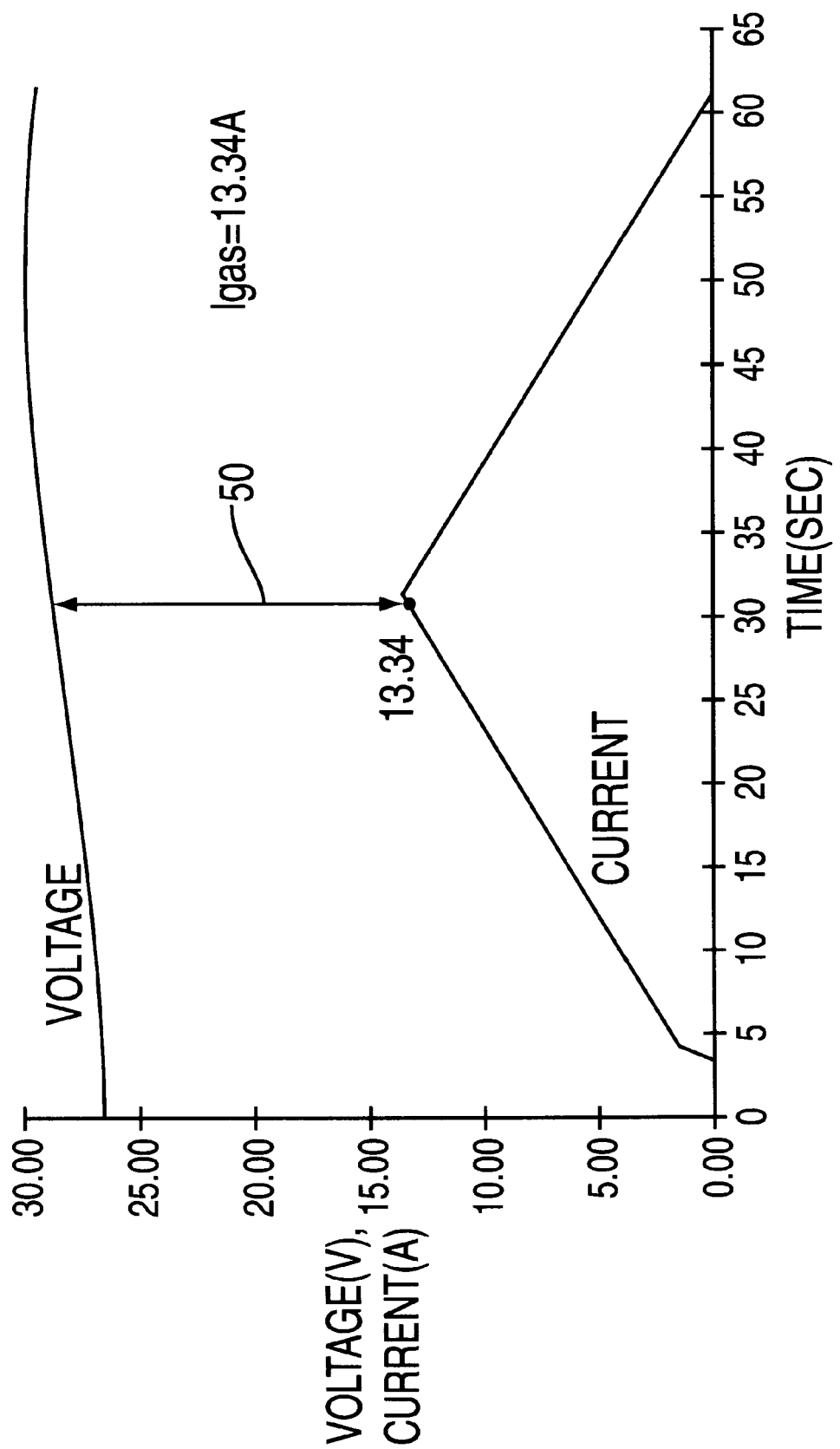
FIG. 7; is a graphical representation of the voltage and current curves of a A 30 Ah, 24 V NiCd battery under test in accordance with the invention.

With reference to FIG. 7, a 30 Ah, 24 V NiCd battery was placed in a temperature-control chamber that was set to −30° Celcius. After the battery temperature reached this ambient temperature, it was completely charged, following the charge regime described above. Once at an equilibrium state, the battery was subjected to a test cycle. Voltage and current data from the test cycle are shown in FIG. 7. In the figure, the maximum slope and the corresponding current are indicated by the arrows. It was determined, via the methods described above, that the battery had 43.1 Ah available capacity. Upon a complete discharge, the battery was found to provide 44.9 Ah.

Having described preferred methods and embodiments of the present invention, it is noted that modifications and variations can be made by persons skilled in the art in light of the above teachings. It is therefore to be understood that changes may be made in a particular embodiment of the invention disclosed which are within the scope and spirit of the invention as outlined by the appended claims.

We claim:

1. A method for determining the capacity of a nickel cadmium battery comprising:
   a) measuring the ambient temperature of the battery;
   b) charging said battery with a current charge;
   c) determining the current charge value $I_{gas}$ when said battery begins to evolve gas; and
   d) comparing said $I_{gas}$ value of c) against a known battery capacity vs. $I_{gas}$ relationship at said measured temperature.

2. A method for determining the capacity of a nickel cadmium battery comprising:
   a) measuring the temperature of said battery;
   b) subjecting said battery to an increasing current charge and then a decreasing current charge;
   c) measuring the battery terminal voltage during step (a);
   d) determining the maximum slope of the measured battery terminal voltage;
   e) calculating the current charge value $I_{gas}$ associated with said maximum slope;
   f) comparing said $I_{gas}$ value of e) against a known battery capacity vs. $I_{gas}$ relationship at said measured temperature.

3. The method of claim 2 wherein said increasing current charge increases as a function of time.

4. The method of claim 2 wherein said increasing current charge is current pulses with each subsequent current pulse having a higher current magnitude than the preceding current pulse.

5. The method of claim 2 wherein said decreasing current charge decreases at the same, but negative rate as said increasing current charge.

6. The method of claim 3 wherein the rate of said current charge is a 0.22 A/500 millisecond step.

7. Apparatus for detecting the capacity of a nickel cadmium battery comprising:
   a) measurement means for measuring the battery temperature;
   b) current means for generating an increasing current charge applied to the battery;
   c) current means for generating a decreasing current charge applied to the battery subsequent to the increasing current charge;
   d) voltage sensing means for sensing the battery terminal voltage during application of the current charge; and
   e) calculating means for determining the maximum slope of said battery voltage;
   f) first comparing means for determining the current charge value $I_{gas}$ associated with the calculated maximum voltage slope; and
   g) second comparing means for comparing said $I_{gas}$ value of f) against a known battery capacity vs. $I_{gas}$ relationship at said measured temperature.

* * * * *